(12) United States Patent
Gaynes et al.

(10) Patent No.: US 8,288,177 B2
(45) Date of Patent: Oct. 16, 2012

(54) SER TESTING FOR AN IC CHIP USING HOT UNDERFILL

(75) Inventors: Michael Gaynes, Vestal, NY (US); Michael S. Gordon, Yorktown Heights, NY (US); Nancy C. LaBianca, Carmel, CT (US); Kenneth F. Latzko, Carmel, NY (US); Aparna Prabhakar, North White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 12/857,864

(22) Filed: Aug. 17, 2010

(65) Prior Publication Data
US 2012/0045853 A1 Feb. 23, 2012

(51) Int. Cl.
*G01R 31/26* (2006.01)
*G01R 31/00* (2006.01)
*H01L 21/00* (2006.01)
*H01L 21/44* (2006.01)
*H01L 23/58* (2006.01)
*H01L 23/552* (2006.01)

(52) U.S. Cl. ............ 438/17; 438/26; 438/108; 438/613; 257/48; 257/660; 257/737; 257/778; 257/E21.503; 257/E21.529; 257/E23.021; 257/E23.115; 324/501; 324/762.02

(58) Field of Classification Search ............... 438/17, 438/26, 208, 613; 257/48, 660, 737, 778, 257/E21.503, E21.529, E23.115, E23.021; 364/501, 762.02
See application file for complete search history.

(56) References Cited

U.S. PATENT DOCUMENTS

| | | | | |
|---|---|---|---|---|
| 4,323,405 A | * | 4/1982 | Uno et al. | 156/64 |
| 4,494,217 A | * | 1/1985 | Suzuki et al. | 365/53 |
| 4,736,012 A | * | 4/1988 | Shoji et al. | 528/188 |
| 4,758,875 A | * | 7/1988 | Fujisaki et al. | 257/792 |
| 6,436,737 B1 | * | 8/2002 | Malladi | 438/127 |
| 6,914,447 B2 | * | 7/2005 | Baumann | 324/762.01 |
| 7,084,660 B1 | | 8/2006 | Ackaret et al. | |
| 7,238,547 B2 | | 7/2007 | Jones et al. | |
| 7,381,635 B2 | | 6/2008 | Cabral, Jr. et al. | |
| 2006/0049532 A1 | * | 3/2006 | Puschner et al. | 257/788 |
| 2006/0220654 A1 | | 10/2006 | Zabel et al. | |
| 2008/0230900 A1 | * | 9/2008 | Porter et al. | 257/737 |
| 2009/0065955 A1 | * | 3/2009 | Gordon et al. | 257/784 |
| 2009/0249301 A1 | * | 10/2009 | Kalla et al. | 717/127 |
| 2011/0099440 A1 | * | 4/2011 | Mims et al. | 714/726 |

* cited by examiner

*Primary Examiner* — Charles Garber
*Assistant Examiner* — Ron Pompey
(74) *Attorney, Agent, or Firm* — Cantor Colburn LLP; Louis Percello

(57) ABSTRACT

A method for detecting soft errors in an integrated circuit (IC) due to transient-particle emission, the IC comprising at least one chip and a substrate includes mixing an epoxy with a radioactive source to form a hot underfill (HUF); underfilling the chip with the HUF; sealing the underfilled chip; measuring a radioactivity of the HUF at an edge of the chip; measuring the radioactivity of the HUF on a test coupon; testing the IC for soft errors by determining a current radioactivity of the HUF at the time of testing based on the measured radioactivity; and after the expiration of a radioactive decay period of the radioactive source, using the IC in a computing device by a user.

20 Claims, 6 Drawing Sheets

025,1,4
SER TESTING FOR AN IC CHIP USING HOT UNDERFILL

FIELD

This disclosure relates generally to the field of detection of soft errors in electronic systems, and, more particularly, to packaging integrated circuits, including logic circuits and array circuits, for accelerated detection of soft error rates due to errors caused by ionizing particle emission.

DESCRIPTION OF RELATED ART

Accurate estimates of soft error rates (SERs) in computing devices are desirable for the implementation of reliable systems. Soft errors are caused by single-event upsets (SEUs), which are random, isolated events that may be caused by passage of cosmic rays or transient ionizing particles, such as alpha particles. That is, ionizing particles can generate enough free charge to flip a structure of a memory storage device to its opposite state. In an integrated circuit (IC) chip package, emission of trace amounts of radioactive impurities is one cause of SEUs. For wire-bonded structures, accelerated testing using a radioactive source of alpha particles is straightforward. In particular, a source of alpha particles with a known emission rate, such as, for example, a thorium foil, may be easily positioned adjacent to the wire-bonded chip with little energy loss as viewed from the source to the chip.

Unfortunately, however, for ICs that use, for example, solder bumps or balls, such as controlled collapsible chip connections (herein referred to as solder bumps), the chip-to-substrate gap is too small (e.g., on the order of 100 microns or less) to allow access by a hand-held radioactive source. Furthermore, the substrate blocks any access to the semiconductor device by a radioactive source, handheld or otherwise. Moreover, the range of alpha particles is substantially smaller than the thickness of the substrate, such that the alpha particles emitted from an external source cannot reach the semiconductor device. Typically, a low alpha emission underfill is inserted into the gap in order to stabilize the solder bond and act as a shield or block for any alpha particles that may emanate from the substrate or carrier.

Eliminating lead from the solder bumps reduces, but does not eliminate, the alpha radiation to the chip. Other sources of alpha particles may be, for example, trace amounts of thorium or uranium in chip materials that have been produced from mined ores. In addition, alpha particles from packaging materials, or solder bumps, add to, or compete with, neutron induced soft errors caused by the liberation of charged particles when atmospheric neutrons strike silicon or other materials surrounding the chips. Disadvantageously, soft errors occur with greater frequency with advances in CMOS and other IC technologies; i.e., as dimensions get smaller, densities increase, and bias voltages become lower. Furthermore, while soft errors in caches and other static random access memory (SRAM) arrays can be detected and corrected with the aid of error correction codes (ECCs), for example, this is not the case for soft errors in logic circuits.

A current method for estimating SERs is to add the soft error contributions from each circuit element. To this end, derating factors need to be estimated, and these are affected by, for example, SEUs in a portion of an IC that is not being used, or a node that is in a logical off state. Unfortunately, therefore, these derating factors are difficult to estimate. Furthermore, relying on measurements from systems being tested in the field necessitates delays in acquisition of SER information until after the product is made.

It is desirable to provide a technique for packaging IC's to enable accelerated detection, in situ, of SERs due to transient particle emission. Hot underfill (HUF) may be applied to a chip to cause accelerated soft-error rates in the chip, allowing for effective SER testing of the chip. The HUF may comprise a radioactive source comprising alpha-particle emitting material that has a relatively stable emission rate during SER testing. U.S. Pat. No. 7,238,547 (issued Jul. 3, 2007 to Zabel et al.), U.S. Pat. No. 7,084,660 (issued Aug. 1, 2006 to Ackaret et al.), both assigned to International Business Machines Corporation and both hereby incorporated by reference in their entirety, discuss various methods of using HUF to determine the SER of an IC chip.

SUMMARY

In one aspect, a method for detecting soft errors in an integrated circuit (IC) due to transient-particle emission, the IC comprising at least one chip and a substrate includes mixing an epoxy with a radioactive source to form a hot underfill (HUF); underfilling the chip with the HUF; sealing the underfilled chip; measuring a radioactivity of the HUF at an edge of the chip; measuring the radioactivity of the HUF on a test coupon; testing the IC for soft errors by determining a current radioactivity of the HUF at the time of testing based on the measured radioactivity; and after the expiration of a radioactive decay period of the radioactive source, using the IC in a computing device by a user.

In one aspect, a system for detecting soft errors in an integrated circuit (IC) due to transient-particle emission, the IC comprising at least one chip and a substrate includes a hot underfill (HUF) located under the chip, the HUF comprising an epoxy mixed with a radioactive source; a first cold underfill (CUF) located over the HUF at an edge of the chip; and a second CUF located over the first CUF, wherein the first CUF and the second CUF comprise an epoxy; wherein the IC is located on a circuit board that is for use by a user in a computing device after an expiration of a radioactive decay period of the radioactive source.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for SER testing for an IC using HUF are provided, with exemplary embodiments being discussed below in detail. Because the half-life of the HUF used for SER testing may be relatively long, proper tracking during SER testing of the HUF chip, and removal and disposal of the HUF chip after testing, may be necessary. Tracking, removal and disposal may add significantly to the cost of the SER testing process. Therefore, to eliminate the needs for tracking, removal, and disposal of the HUF chip, a relatively short-lived isotope may be used for the HUF. After a dozen or so half-lives of the isotope comprising the HUF, which may be days to weeks in some embodiments, the HUF chip is safe to be used in an operational computing device by an end user, with minimal risk of radioactive exposure to the user. The radioactivity of the HUF may be measured right after HUF is applied to the chip by applying it to a test coupon, separate from the chip. Then, using the normal law of radioactive decay, the current radioactivity of the HUF may be estimated for the current time during SER testing. The time-dependency of the HUF radioactivity may be folded into a soft-error model; the single-event upset rate may be time-dependent.

Figure 1:
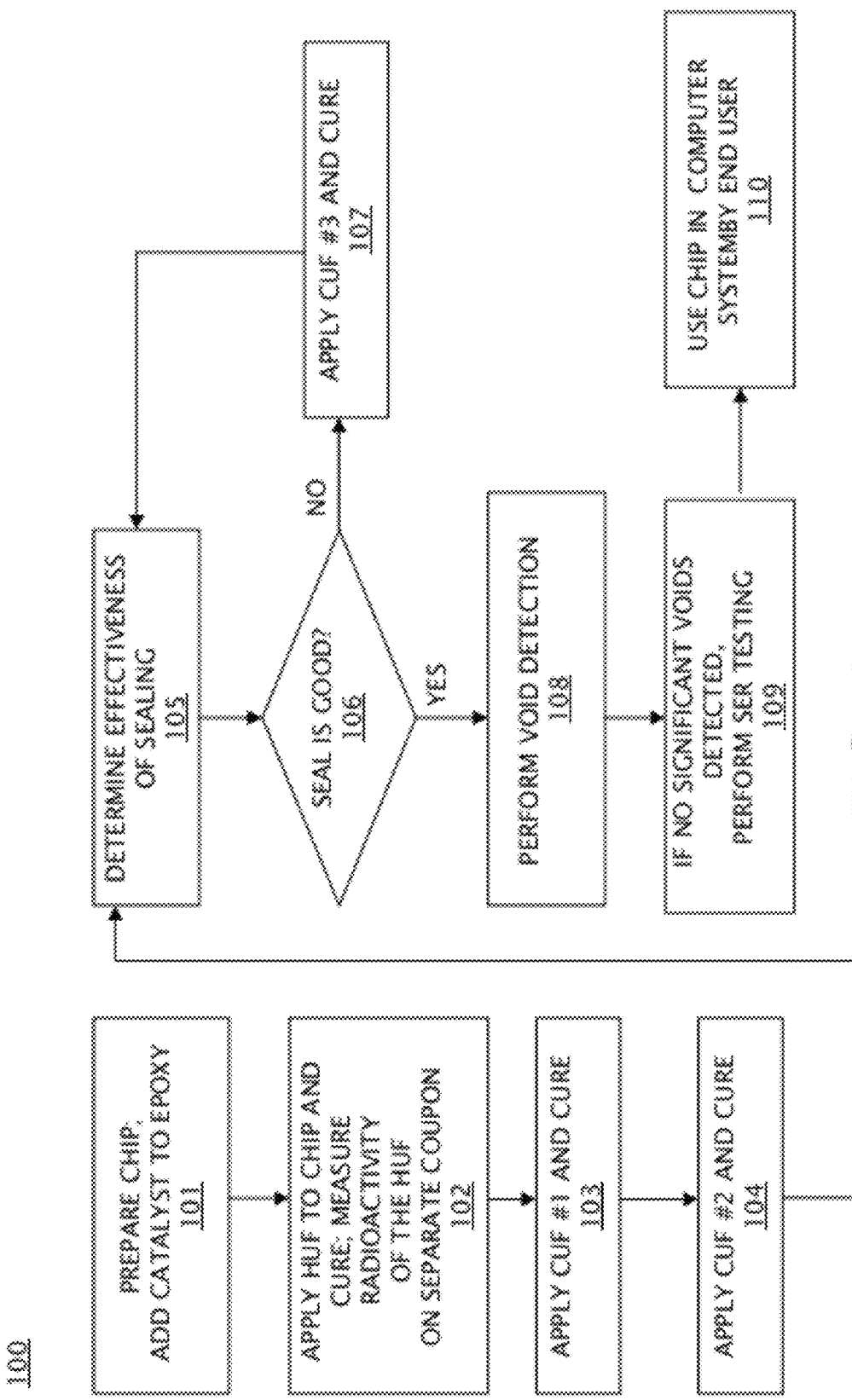
FIG. 1 illustrates an embodiment of a method for SER testing for an IC chip using hot underfill.

FIG. 1 illustrates an embodiment of a method for SER chip testing using HUF. In block 101, the chip is prepared for underfilling, and the radioactive source is added to the epoxy in preparation for application of HUF to the chip. The surface of the chip may be cleaned with an oxygen plasma treatment before underfilling with HUF, as capillary flow of the HUF under the chip may be increased and underfill time may be commensurately reduced by the oxygen plasma treatment to the chip surface. The radioactive source portion of the HUF may have the effect of accelerating the curing of the HUF, which may cause gelling or increased viscosity in the HUF. Reduction of underfill time helps avoid gelling or significant viscosity increases by the HUF during the underfill process.

The HUF may comprise an epoxy with a radioactive (hot) source mixed in, and may be formed by introduction of the radioactive source into the epoxy, mixing, and then eliminating any air that is in or around the mixed HUF. Once the radioactive source is introduced into the epoxy, the working life of the HUF may be less than 30 minutes in some embodiments, after which point the mixed HUF may be cured to the point that it needs to be disposed. In order to keep radioactive waste volume to a minimum, relatively small HUF batches may be mixed, about 3 grams per batch in some embodiments. A relatively small batch may only require manual mixing for about two minutes or less. Mixing may result in air entrapment in the HUF. Vacuum degassing may be used to remove the air from the HUF. Degassing may be performed for a time period of about two minutes in some embodiments. The viscosity or flow of the mixed HUF may be checked periodically; if the viscosity or flow are not within an appropriate range for underfilling the chip, the current batch may be disposed and a new batch prepared. The HUF may further comprise a fluorescent dye mixed into the HUF in some embodiments, which is discussed in further detail below with respect to block 105.

The radioactive source may comprise a radioactive particle emitting material having a predetermined, substantially constant emission rate, and may include but is not limited to 210 lead (Pb); 210 pollonium (Po); a combination of 210 Pb and 210 Po; 225 actinium (Ac), which has a half life of about 10 days; and 223 radium (Ra), which has a half life of about 11.4 days. An HUF comprising 210 Pb may beta decay to 210 bismuth (Bi), which will then beta decay to 210 Po, which emits alpha particles. The composition of the radioactive source may be configured to have a relatively high initial radioactivity and a relatively short half-life in some embodiments; in others, the half life may be relatively long. The HUF may emit alpha particles at a rate of about 1E7 α/khr-cm$^2$ into the chip in some embodiments. The energy of the emitted alpha particles leaving the surface of the hot underfill may range from about 1 mega electronvolt (MeV) to about 5.3 MeV, and the alpha particles may have a range of less than about 100 microns (um) into the chip.

Figure 2:
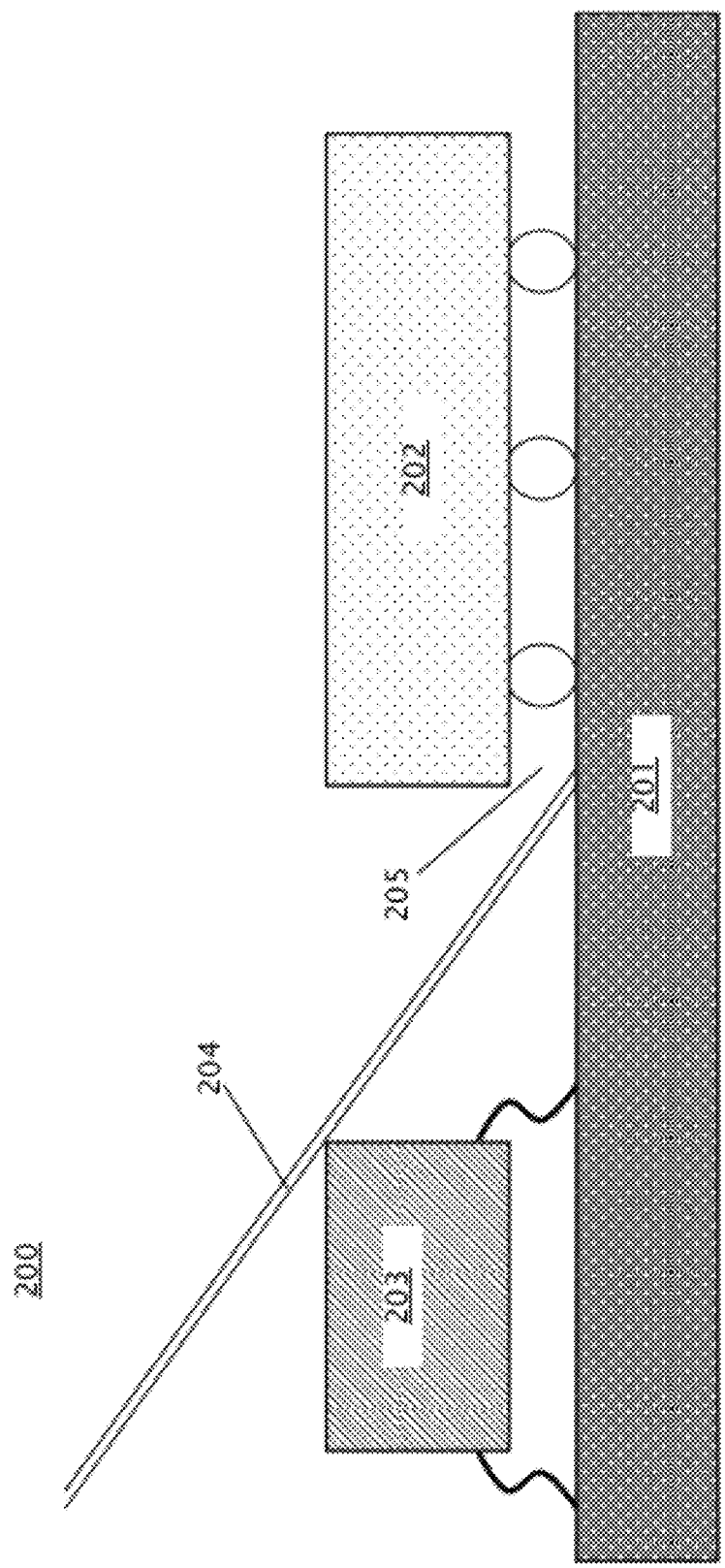
FIG. 2 illustrates an embodiment of a barrier for use in application of hot underfill to a chip.

In block 102, the HUF is applied to the chip. The radioactivity of the HUF 303 is also measured on a separate test coupon in block 102, either right before or after HUF is applied to the chip; this measurement may be used in modeling the SER rate, which is discussed below with respect to block 109. The HUF is applied to the area under the chip and is prevented from going underneath any nearby features, for example, decoupling capacitors, as shown in FIG. 2. The HUF may be applied at one edge of the chip (referred to as the leading edge) and capillary action under the chip allows the HUF to flow from the leading edge to the other end of the chip, completely filling the underside of the chip. Physical containment of the HUF may be used to keep the leading edge fillet of HUF from flowing underneath other features located on the substrate. In some embodiments, a glass slide 204 such as is shown in FIG. 2 may be placed at the leading edge 205 of a chip 202 to assist in the deposition of the HUF and to keep it under the chip 202 and away from other features on substrate 201, such as decoupling capacitor 203, during underfilling. In another embodiment, the barrier may comprise a dam formed around the chip using an appropriate thixotropic, non-radioactive material before dispensing the HUF.

Figure 3:
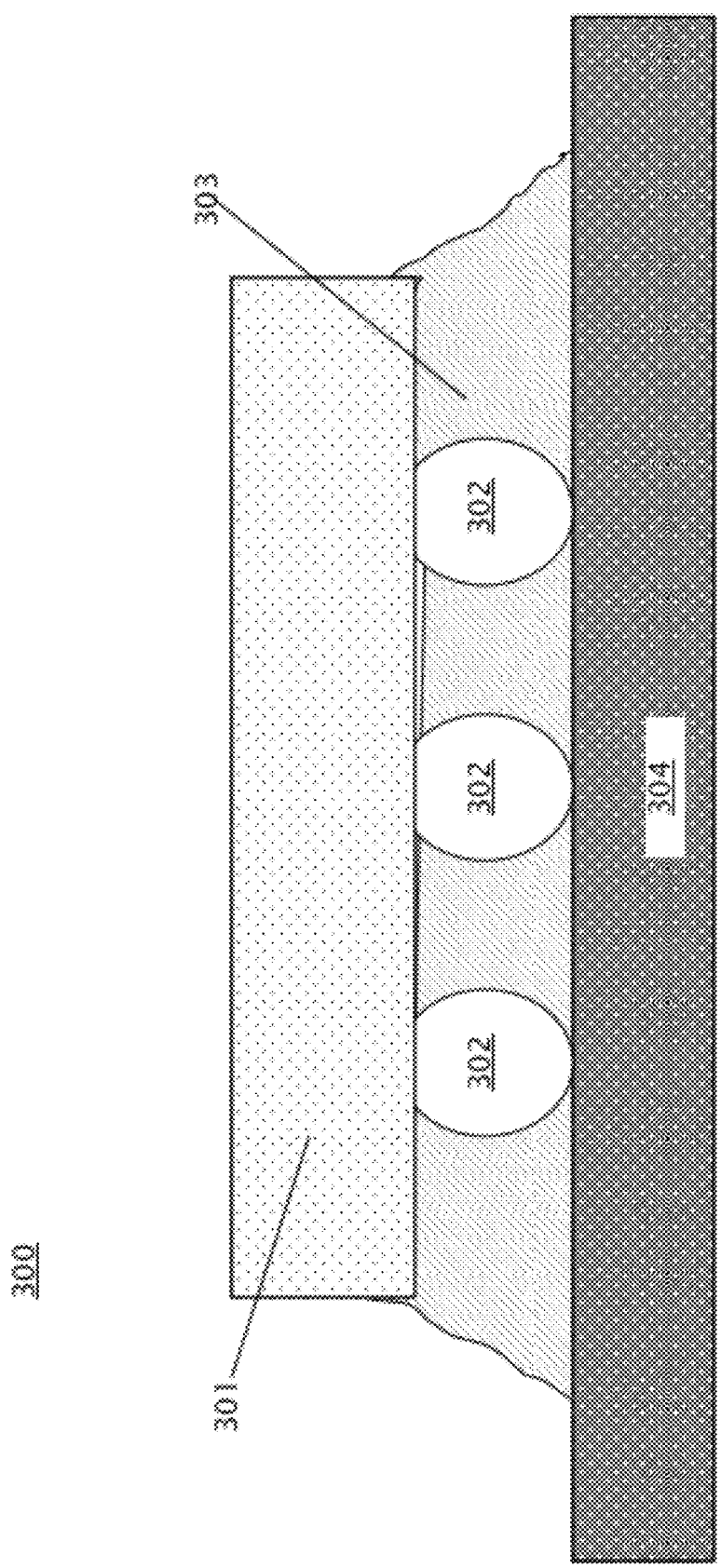
FIG. 3 illustrates an embodiment of a chip after application of hot underfill.

FIG. 3 illustrates an embodiment of a chip 301 after application of HUF 303. The chip comprises chip body 301 and solder bumps 302 on substrate 304. HUF 303 completely fills the region surrounding the solder bonds 302. The HUF 303 may be dispensed so as to minimize edge fillets and build up around the edges of chip 301; minimized edge fillet formation by the HUF 303 allows for effective sealing (sealing is discussed in further detail below with respect to blocks 103, 104, and 107). The HUF 303 may be applied by a dot dispense at the center of the leading edge of the chip 301, for relatively small chips (having dimensions on less than about 15 mm by 15 mm). For relatively large chips, a line dispense along the leading edge of the chip 301 may be used. Repeated deposits of HUF at the leading edge may be made as needed to ensure that HUF 303 fills the entire gap between the chip 301 and the substrate 304 around the solder bumps 302. Capillary action due to the dispersed solder bumps 302 under the chip 301 causes the dispensed HUF 303 to flow from the leading edge to the other end of the chip, completely filling the underside of the chip 301. The result is that a minimum underfill fillet is formed on the three non-leading chip edges, which may be relatively easy to seal off. The edge fillet on the leading edge may be larger and more difficult to seal off; however, by monitoring the flow front advancing along the non-leading edges of the chip from the leading edge, HUF dispensing may be metered to a minimum in order to minimize the leading edge fillet. After the HUF 303 is applied under the chip 301, the HUF is cured.

Figure 4:
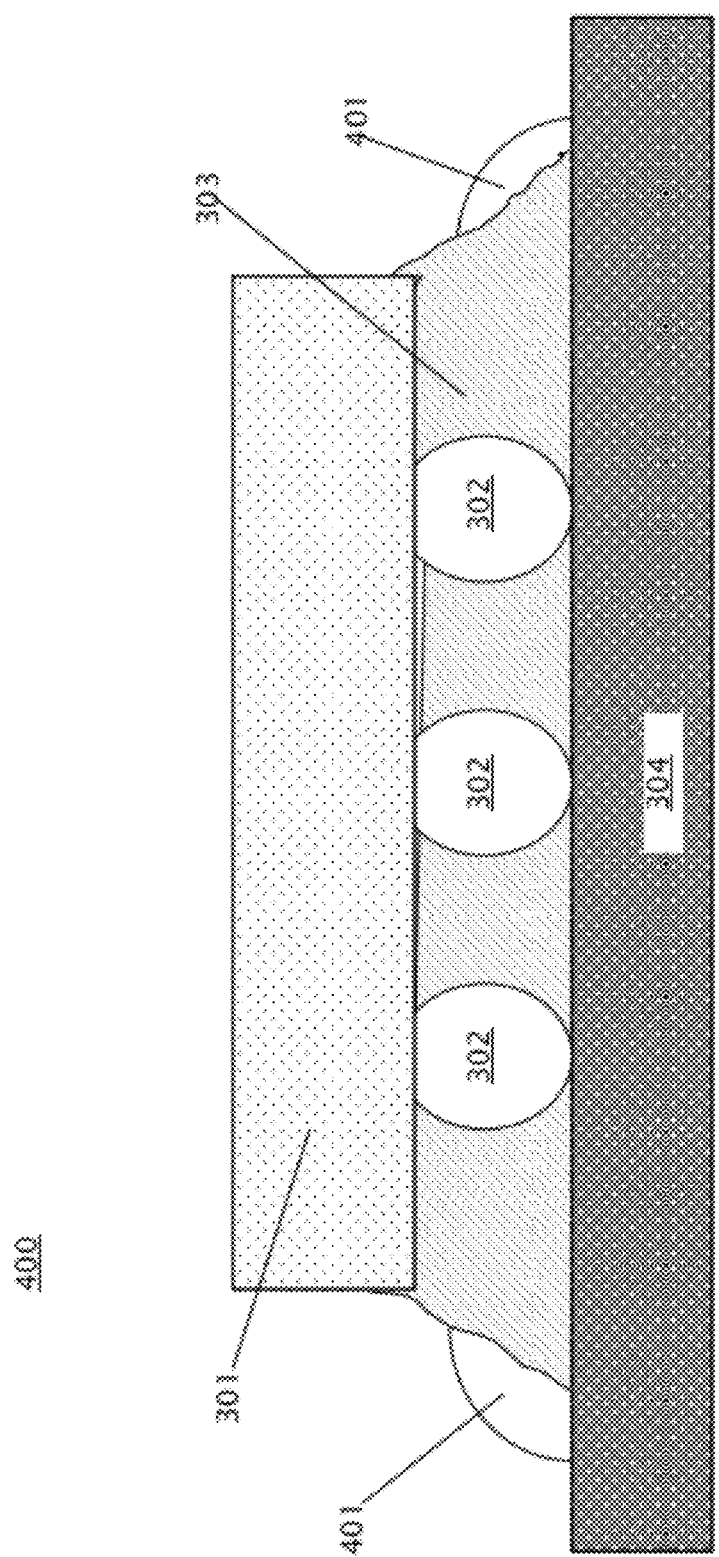
FIG. 4 illustrates an embodiment of the chip of FIG. 3 after application of a first cold underfill.
Figure 5:
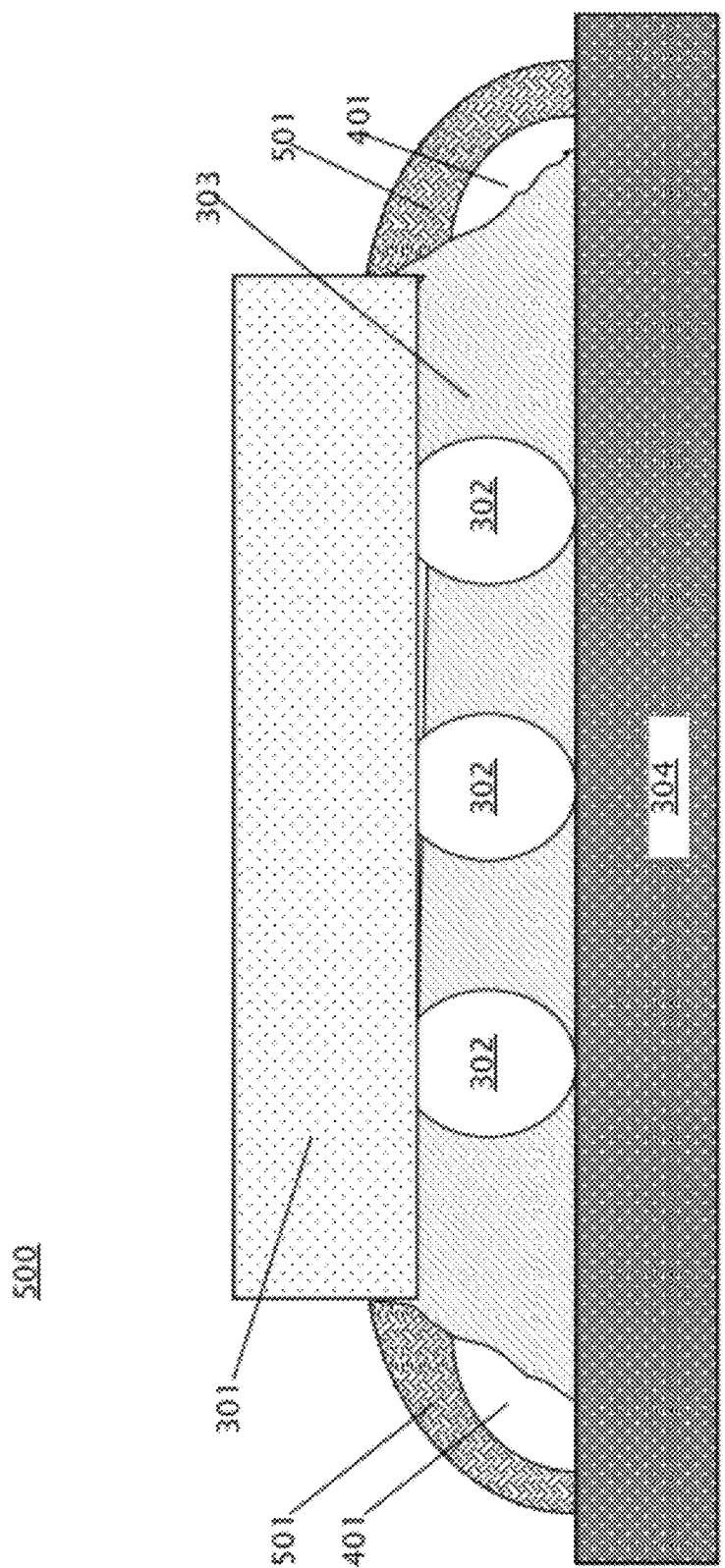
FIG. 5 illustrates an embodiment of the chip of FIG. 4 after application of a second cold underfill.

After partially curing the HUF in block 102, in block 103 a first layer of CUF 401 is applied to the edges of the HUF 303 under chip 301, and CUF 401 is then cured, as shown in FIG. 4. After CUF 401 is cured, in block 104 a second layer of CUF 501 is applied over CUF 401 and cured, as shown in FIG. 5. The CUF 401 and 501 may comprise an epoxy containing no radioactive source. Sealing of HUF 303 using CUF 401 and CUF 501 allows the alpha-particle radiation from HUF 303 to go into the chip 301, while preventing the alpha-particle radiation from escaping into the ambient and affecting any objects located near or around the chip 301.

Figure 6:
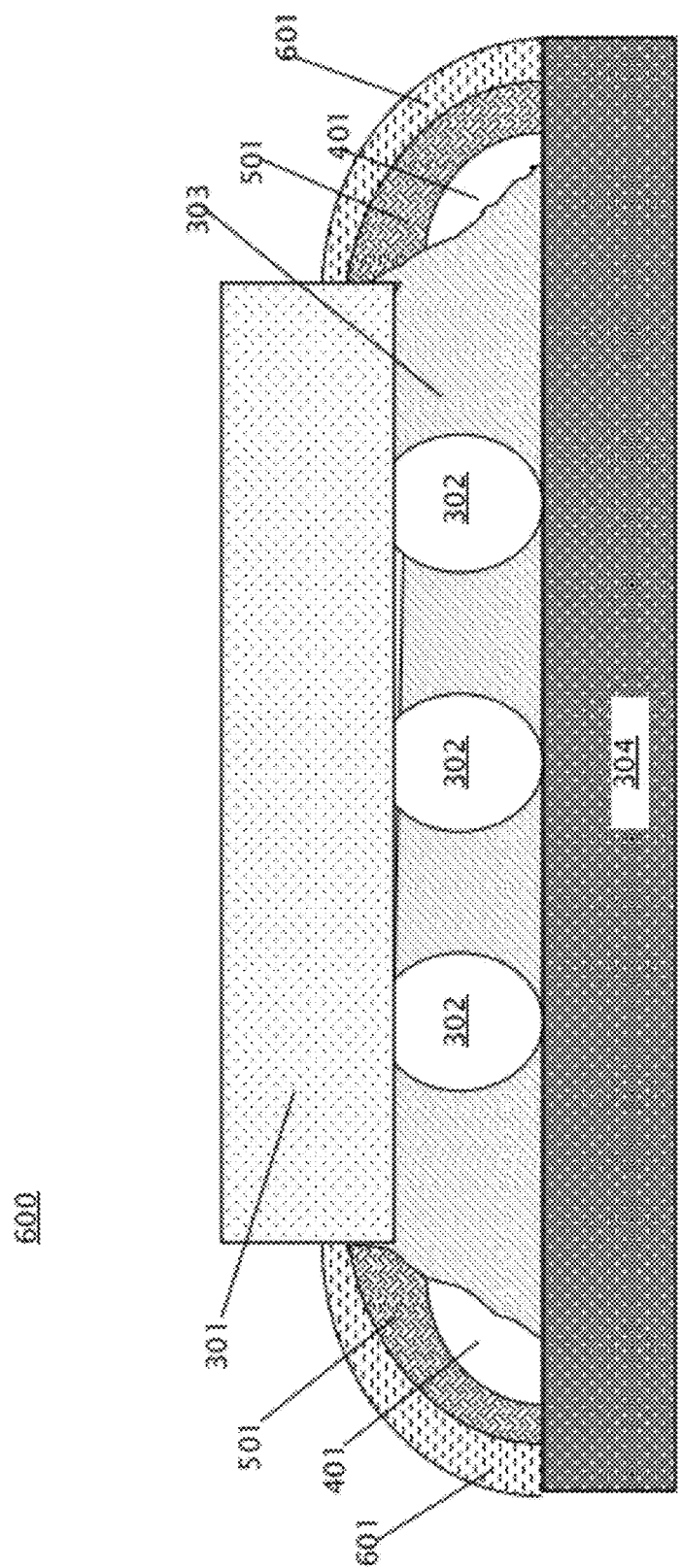
FIG. 6 illustrates an embodiment of the chip of FIG. 5 after application of a third cold underfill.

In block 105, it is determined if the HUF 303 is sufficiently sealed by checking the alpha particle activity from HUF 303 and comparing the alpha particle activity to a predetermined limit. Measurement of the alpha particle activity around the chip 301 allows determination of the effectiveness of CUF 401 and 501 in sealing off the HUF 303. Any stray HUF located around the chip 301 or anywhere else in the lab where it is applied may also detected and removed. Some stray HUF may affect the detected alpha counts. Introduction of a fluorescent dye when mixing the HUF 303 in block 101 allows use of fluorescent light to detect any stray HUF material. Any detected stray HUF may be removed and disposed. The alpha particle activity may be determined by placing the HUF 303 and chip 301 on a zinc sulfide (ZnS) scintillator detection system. The alpha particles emanating from the HUF 303 are then counted for a specified period of time, about an hour in some embodiments. If the alpha activity is determined to be higher than the predetermined limit, the seal is determined not to be good in block 106, and flow proceeds to block 107. An optional third layer of CUF 601 is applied over the second layer of CUF 501 in block 107 as shown in FIG. 6. Then flow proceeds back to block 105, and the alpha activity and seal effectiveness are checked again Shining a fluorescent light and observing the fluorescence in the area of the seal may show where a second layer of CUF 501 or optional third layer of CUF 601 is needed.

If the alpha activity determined in block 105 is determined to be below the predetermined threshold, the seal is determined to be good in block 106 and flow proceeds to block 108. In block 108, it is determined if the HUF 303 uniformly fills the underside of chip 301 with no significant gaps or voids, as voids in the HUF 303 may induce uncertainty in the SER testing. Acoustic microscopy and beta radiation detection may be used to detect any voids in HUF 303. Acoustic microscopy comprises an ultrasound imaging technique that can be used to detect voids in the HUF 303. Beta radiation may also be used for void detection in some embodiments; a two-dimensional scan of the beta emissions of the HUF may indicate the presence of voids. However, some of the isotopes that may comprise the HUF 303 do not emit beta particles; in such embodiments, beta radiation may not be used for void detection. In embodiments in which the HUF 303 comprises 210 Pb, there is beta decay to 210Bi (with very low energy betas) followed by beta decay to 210 Po with an endpoint energy of about 1.161 MeV; in such embodiments, beta detection may be used.

In block 109, the SER testing of the chip 301 is performed. The chip 301 may be placed in a circuit board that may be used in a computing device. U.S. Pat. No. 7,238,547 (issued Jul. 3, 2007 to Zabel et al.), U.S. Pat. No. 7,084,660 (issued Aug. 1, 2006 to Ackaret et al.) discuss various methods of SER testing of an IC chip using HUF, any of which may be performed in block 109. The normal law of radioactive decay may be used to determine the current radioactivity of the HUF for the current time during SER testing, based on the determination of the radioactivity performed on the test coupon at the time of underfill in block 102. The time-dependency of the HUF radioactivity may be folded into a soft-error model; the single-event upset rate may be time-dependent.

After SER testing in block 109, in block 110 the chip may be left in the circuit board for a radioactive decay period, which may be equal to about a dozen or so half-lives of the isotope comprising the HUF, which may be days to weeks in some embodiments. After expiration of the radioactive decay period, in embodiments in which the radioactive source has a relatively short half life, the HUF chip is safe to be used in an operational computing device by an end user, with minimal risk of radioactive exposure to the user. Then the circuit board containing the chip may be shipped and/or used operationally in a computing device with minimal risk of radiation exposure to the end user. The computing device may comprise any appropriate computing device, including but not limited to a personal computer (PC), workstation, laptop, personal digital assistant (PDA), palm devices, servers, memory, storage, and the like.

The technical effects and benefits of exemplary embodiments include improved SER testing of an IC chip using hot underfill, while reducing the need for tracking, removal, and disposal of the tested chip.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for detecting soft errors in an integrated circuit (IC) due to transient-particle emission, the IC comprising at least one chip and a substrate, the method comprising:
    mixing an epoxy with a radioactive source to form a hot underfill (HUF);
    underfilling the chip with the HUF;
    sealing the underfilled chip;
    measuring a radioactivity of the HUF at an edge of the chip;
    measuring the radioactivity of the HUF on a test coupon;
    testing the IC for soft errors by determining a current radioactivity of the HUF at the time of testing based on the measured radioactivity; and
    after completion of testing the IC for soft errors and after the expiration of a radioactive decay period of the radioactive source, using the IC in a computing device by an end user.

2. The method of claim 1, wherein the radioactive source comprises one of 210 lead (Pb); 210 pollonium (Po); a combination of 210 Pb and 210 Po; 225 actinium (Ac); and 223 radium (Ra).

3. The method of claim 1, wherein the radioactive decay period is equal to about 12 times a half life of the radioactive source.

4. The method of claim 1, further comprising treating the chip with an oxygen plasma treatment before underfilling the chip with the HUF.

5. The method of claim 1, further comprising vacuum degassing the HUF after mixing.

6. The method of claim 1, wherein underfilling the chip with the HUF comprises dispensing the HUF at a leading edge of the chip.

7. The method of claim 6, further comprising forming a barrier comprises a thixotropic, non-radioactive material at the leading edge of the chip to contain the HUF under the chip.

8. The method of claim 6, further comprising placing a glass slide at the leading edge of the chip to contain the HUF under the chip.

9. The method of claim 1, wherein sealing the underfilled chip comprises:
   applying a first cold underfill (CUF) over the HUF at an edge of the chip;
   applying a second CUF over the first CUF;
   determining an alpha count of the HUF, and in the event the alpha count is above a predetermined limit, applying a third CUF over the second CUF;
   wherein the first, second, and third CUF each comprise an epoxy.

10. The method of claim 1, wherein the HUF further comprises a fluorescent dye, and further comprising detecting a portion of HUF that is not located under the chip using a fluorescent light after sealing the underfilled chip.

11. The method of claim 1, further comprising determining whether a void is present in the HUF under the chip before testing the IC for soft errors; and
   in the event it is determined that a significant void is not present, testing the IC for soft errors; and
   in the event it is determined that a significant void is present, discarding the chip.

12. The method of claim 1, wherein determining whether a void is present in the HUF under the chip comprises at least one of acoustic microscopy or two-dimensional beta radiation detection.

13. A system for detecting soft errors in an integrated circuit (IC) due to transient-particle emission, the IC comprising at least one chip and a substrate, the system comprising:
   a hot underfill (HUF) located under the chip, the HUF comprising an epoxy mixed with a radioactive source;
   a first cold underfill (CUF) located over the HUF at an edge of the chip; and
   a second CUF located over the first CUF, wherein the first CUF and the second CUF comprise an epoxy;
   wherein the IC is located on a circuit board that is for use by an end user in a computing device after completion of testing the IC for soft errors and after an expiration of a radioactive decay period of the radioactive source.

14. The system of claim 13, wherein the radioactive source comprises one of 210 lead (Pb); 210 pollonium (Po); a combination of 210 Pb and 210 Po; 225 actinium (Ac); and 223 radium (Ra).

15. The system of claim 13, wherein the HUF further comprises a fluorescent dye.

16. The system of claim 13, further comprising a third CUF located over the second CUF, the third CUF comprising an epoxy.

17. The system of claim 13, further comprising forming a barrier comprises a thixotropic, non-radioactive material at the leading edge of the chip to contain the HUF under the chip.

18. The system of claim 17, further comprising placing a glass slide at the leading edge of the chip to contain the HUF under the chip.

19. The system of claim 13, wherein a surface of the chip is cleaned with an oxygen plasma treatment.

20. The system of claim 13, wherein the radioactive decay period is equal to about 12 times a half life of the radioactive source.

* * * * *